United States Patent
Lusk et al.

(10) Patent No.: US 7,736,616 B2
(45) Date of Patent: Jun. 15, 2010

(54) MEMBRANE SEPARATION OF FEED AND GROWTH ENVIRONMENTS IN CARBON NANOSTRUCTURE GROWTH

(75) Inventors: Mark Thomas Lusk, Highlands Ranch, CO (US); G. Louis Hornyak, Ft. Collins, CO (US); Michael Thomas Burke, Arvada, CO (US)

(73) Assignee: Colorado School of Mines, Golden, CO (US)

( * ) Notice: Subject to any disclaimer, the term of this patent is extended or adjusted under 35 U.S.C. 154(b) by 573 days.

(21) Appl. No.: 11/486,981

(22) Filed: Jul. 14, 2006

(65) Prior Publication Data
US 2010/0124530 A1    May 20, 2010

Related U.S. Application Data

(60) Provisional application No. 60/699,144, filed on Jul. 14, 2005.

(51) Int. Cl.
*D01F 9/127*    (2006.01)
*D01F 9/12*    (2006.01)
(52) U.S. Cl. ............... 423/447.3; 423/447.1; 423/447.7
(58) Field of Classification Search ............ 423/449.1, 423/449.2, 449.3, 443.5
See application file for complete search history.

(56) References Cited

U.S. PATENT DOCUMENTS

| | | | |
|---|---|---|---|
| 5,772,905 A | 6/1998 | Chou | |
| 6,692,717 B1 * | 2/2004 | Smalley et al. ......... | 423/445 B |
| 6,730,284 B2 | 5/2004 | Harutyunyan et al. | |
| 6,824,689 B2 | 11/2004 | Wang et al. | |
| 6,831,017 B1 | 12/2004 | Li et al. | |
| 6,837,928 B1 | 1/2005 | Zhang et al. | |
| 6,863,942 B2 | 3/2005 | Ren et al. | |
| 7,071,406 B2 | 7/2006 | Smalley et al. | |

(Continued)

FOREIGN PATENT DOCUMENTS

JP    2004-292310    10/2004

(Continued)

OTHER PUBLICATIONS

Andrews et al. (Apr. 16, 1999) "Continuous Production of Aligned Carbon Nanotubes: A Step Closer to Commercial Realization," *Chem. Phys. Lett.* 303:467-474.

(Continued)

*Primary Examiner*—Jerry Lorengo
*Assistant Examiner*—Joseph V Micali
(74) *Attorney, Agent, or Firm*—Greenlee, Winner and Sullivan, P.C

(57) ABSTRACT

The invention provides CVD-based methods for growing single-walled or multi-walled carbon nanotubes. In the methods of the invention, the nanotube growth environment is separated from the carbon-containing gas feed environment using a membrane which is substantially impermeable to gas flow but permits diffusion of carbon through the membrane. A catalyst for carbon nanotube growth is located on the growth side of the membrane while a catalyst for decomposition of carbon-containing gas is located on the feed side of the membrane. A path for diffusion of carbon through the membrane is provided between the growth and decomposition catalysts. Control of the size and shape of the carbon nanotube growth catalyst enables control over the nanotube structure formed.

29 Claims, 3 Drawing Sheets

U.S. PATENT DOCUMENTS

| | | | |
|---|---|---|---|
| 7,235,159 B2* | 6/2007 | Gu et al. .................. | 204/192.1 |
| 2002/0172767 A1 | 11/2002 | Grigorian et al. | |
| 2003/0175200 A1 | 9/2003 | Smalley et al. | |
| 2004/0129447 A1* | 7/2004 | Beeli et al. ............... | 174/125.1 |
| 2004/0194705 A1* | 10/2004 | Dai et al. .................... | 118/719 |
| 2005/0170089 A1* | 8/2005 | Lashmore et al. ........ | 427/248.1 |
| 2008/0206463 A1* | 8/2008 | Grigorian et al. ........ | 427/249.1 |

FOREIGN PATENT DOCUMENTS

| | | |
|---|---|---|
| WO | WO 00/30141 | 5/2000 |

OTHER PUBLICATIONS

Dalton et al. (Jun. 12, 2003) "Super-Tough Carbon-Nanotube Fibers," *Nature* 423:703.

Ding et al. (Aug. 8, 2004) "Molecular Dynamics Study of the Catalyst Particle Size Dependence on Carbon Nanotube Growth," *J. Chem. Phys.* 121(6):2775-2779.

Fan et al. (Jan. 22, 1999) "Self-Oriented Regular Arrays of Carbon Nanotubes and Their Field Emission Properties," *Science* 283:512-514.

Hata et al. (Nov. 19, 2004) "Water-Assisted Highly Efficient Synthesis of Impurity-Free Single-Walled Carbon Nanotubes," *Science* 306:1362-1364.

Hornyak et al. (1999) "Template Synthesis of Carbon Nanotubes," *Nanostruct. Mater.* 12(1-4):83-88.

Hu et al. (Nov. 5, 2001) "Growth of Well-Aligned Carbon Nanotube Arrays on Silicon Substrates Using Porous Alumina Film as a Nanotemplate," *Appl. Phys. Lett.* 79(19);3083-3085.

International Search Report and Written Opinion, Corresponding to International Application No. PCT/US 06/27622, Mailed Sep. 6, 2007.

Jiang et al. (Oct. 24, 2002) "Spinning Continuous Carbon Nanotube Yarns," *Nature* 419:801.

Li et al. (Apr. 9, 2004) "Direct Spinning of Carbon Nanotube Fibers from Chemical Vapor Deposition Synthesis," *Science* 304(5668):276-278.

Li et al. (Dec. 6, 1996) "Large-Scale Synthesis of Aligned Carbon Nanotubes," *Science* 274(5293):1701-1703.

Melechko et al. (2003) "Large-Scale Synthesis of Arrays of High-Aspect-Ratio Rigid Vertically Aligned Carbon Nanofibers," *Naotechnology* 14:1029-1035.

Moisala et al. (Oct. 10, 2003) "The Role of Metal Nanoparticles in the Catalytic Production of Single-Walled Carbon Nanotubes—A Review," *J. Phys. Condens. Matter* 15:S3011-S3035.

Ren et al. (Nov. 6, 1998) "Synthesis of Large Arrays of Well-Aligned Carbon Nanotubes on Glass," *Science* 282:1105-1107.

Zhang et al. (Nov. 19, 2004) "Multifunctional Carbon Nanotube Yarns by Downsizing an Ancient Technology," *Science* 306:1358-1361.

* cited by examiner

MEMBRANE SEPARATION OF FEED AND GROWTH ENVIRONMENTS IN CARBON NANOSTRUCTURE GROWTH

CROSS-REFERENCE TO RELATED APPLICATIONS

This application claims the benefit of provisional application 60/699,144 filed Jul. 14, 2005 which is hereby incorporated by reference to the extent not inconsistent with the disclosure herein.

BACKGROUND OF THE INVENTION

This invention is in the field of carbon nanomaterials, in particular, methods for making carbon nanotubes and carbon nanotube fibers.

The term "carbon nanomaterials" is used generally herein to refer to any substantially carbon material containing six-membered rings that exhibits curving of the graphite planes, sometimes by including five-membered and/or seven membered rings amongst the hexagons formed by the positions of the carbon atoms, and has at least one dimension on the order of nanometers. Examples of carbon nanomaterials include, but are not limited to, fullerenes, single-walled carbon nanotubes (SWNTs), double-walled carbon nanotubes, multiple-walled carbon nanotubes (MWNTs), nanotubules, and nested carbon structures with dimensions on the order of nanometers.

Different carbon nanomaterials have different potential applications. Nanotube materials can exhibit extraordinary mechanical, thermal, electrical and/or chemical properties, which have stimulated substantial interest in developing applied technologies exploiting these properties. These technologies include, but are not limited to, advanced small-scale circuitry, body and vehicle armor, drug delivery, high-efficiency conductors, nanocomposite materials, medical applications, automobile and aircraft frames, heat transfer and large scale structures (such as very long single-span suspension bridges and the space elevator).

For example, nanotubes can have very high Young's modulus values. Multi-walled carbon nanotubes have been measured to have Young's modulus values between 0.1 and 1.33 TPa, with the Young's modulus being dependent upon the degree of order within the tube walls (Demczyk et al., 2002, Mater. Sci. and Engr. 1334, 173-178; Salvetat et al., 1999, Appl. Phys. A 69, 255-260). While the art recognizes significant potential for commercial application of carbon nanomaterials, the high cost and difficulty in obtaining these materials in the large amounts necessary for developing these applications has been a major impediment in practical application of these materials, although significant breakthroughs in manufacturing technique allow for kg quantities of short (<100 microns) multi-walled tubes to be made available in today's market.

Carbon nanotubes (CNTs) have been grown by chemical vapor deposition (CVD) methods. The carbon nanotube can be grown on a cluster containing metal atoms which serves as both a base and a catalyst for the high temperature decomposition of a carbon-containing material such as acetylene, ethylene, methane, carbon monoxide, etc. The clusters may be supported on a substrate such as alumina or silica or introduced into the feedstock to make vapor-grown carbon fibers. The clusters may be metal clusters or clusters which combine a metal with another element (e.g. oxides).

As described by Moisala et al. (Moisaal, A. et al., 2003, J. Phys. Condens. Matter 15 S3011-S3035), basic steps in the growth process for single walled nanotubes include catalytic decomposition of the carbon precursor molecules on the surface of the metal-containing catalyst particles followed by diffusion of the carbon atoms into the particles. Supersaturation of carbon in the metal results in solid carbon precipitation from the particles. The physical form of the precipitated carbon depends on several parameters, including catalyst particle size and precipitation rate. The growth mechanism is generally classified as either root growth (also called base growth) and tip growth. In base growth, the catalyst particle stays pinned at the support surface. The tip growth mechanism takes place when the catalyst is lifted off from the support surface due to weak support-catalyst interaction.

The size of the metal-containing cluster can influence the nanotube structure. U.S. Pat. No. 6,692,717 to Smalley et al. reports that metal clusters in the range of 0.5 to 3 nm will produce single-wall nanotubes while larger clusters tend to produce multi-wall nanotubes with outer diameters greater than about 3 nm. Molecular dynamics calculations show that larger metal clusters, which contain at least 20 iron atoms, nucleate SWNTS that have a far better tubular structure than SWNTs nucleated from smaller clusters (Feng D., A. Rosen, and K. Bolton, 2004, J. of Chem. Phys., 121, 2775-2779).

Aligned arrays of single-walled nanotubes have been reported in the scientific literature. Hata et al. report water-assisted catalytic growth of aligned single-walled nanotube "forests" (Hata, K., et al, 2004, Science, 306, 1362-1363). Millimeter-scale nanotube lengths were reported for a growth time of ten minutes. In such a dense nanotube forest, the rate at which the free carbons reach the catalyst may decrease due to mass transport limitations.

Aligned arrays of multi-walled carbon nanotubes have also been reported. Aligned arrays of multi-walled carbon nanotubes have been grown on nickel-coated glass (Zen, R. F. et al., 1998, Science, 282(5391), 1105-1107). For applications requiring good alignment, nanotube diameters greater than 50 nm were recommended. Lengths from 0.1 to 50 microns were reported. Aligned multi-walled carbon nanotubes have also been grown using iron nanoparticles embedded in meso-porous silica (Li, W. S. et al., 1996, Science, 274(5293), 1701-1703). The carbon nanotubes were reported to have diameters of about 30 nm, with spacing between the tubes of about 100 nm and lengths up to 50 microns. Furthermore, aligned multi-walled carbon nanotubes have been grown using oxidized patterned iron films on oxidized nanoporous silicon (Fan, S. et al., 1999, Science, 283(5401), 512-514). Typical nanotube diameters were reported as about 16 nm, with lengths between about 35 and 240 microns.

Furthermore, Japanese Patent Application Publication Number 2004-292310 describes growth of nanotubes by passage of synthesis gas through a nano-porous substrate, where the pore size of the substrate is not larger than the diameter of the nanotube. A catalyst metal is included within the pores or may be vapor-deposited on the substrate.

When carbon nanotubes are grown in an environment of carbon-containing materials, decomposition of the carbon-containing material can cause other carbon structures, such as turbostratic graphite and amorphous carbons, to grow. These other structures can cause inactivation of the catalyst (U.S. Pat. No. 6,692,717). A variety of techniques have been used to reduce the amount of the other structures formed. Hata et al. (ibid) report that including water vapor in the growth atmosphere leads to nanotubes free from amorphous carbon and metal particles. U.S. Patent Application Publication No. 2002/0172767, to Grigorian et al. reports that growth in the temperature range from about 760° C. to about 800° C. limits the formation of amorphous carbon.

A number of laboratories have reported "spinning" mixed-length carbon nanotubes into fibers in much the same way as cotton or wool fibers are spun into thread and yarn. Coagulation-based carbon nanotube spinning has been used to make fibers from single-walled nanotubes (Dalton, A. B. et al., 2003, Nature, 423, 703). The tensile strength of these composite fibers was reported as 1.8 GPa. Spinning by winding a nanotube aerogel onto a rotating rod was reported by Li et al. (Li, Y.-L., et al., 2004, Science, 304(5668), 276-278). The fibers were reported to have a range of strengths between 0.05 N/Tex and 0.5 N/Tex (estimated to be equivalent to about 0.10 and 1.0 GPa). Spinning has also been achieved by drawing carbon nanotubes from a multi-walled nanotube "forest" (Jian, K. et al., 2002, Nature, 419, 801; Zhang, M., et al., 2004, Science, 306, 1358-1361). Zhang et al. (ibid.) report formation of single ply, two-ply, four-ply, knitted, and knotted multi-walled nanotube yarns. Tensile strengths were reported as 150 and 300 MPa for the single ply yarns and between about 250 and 460 MPa for the two-ply yarns.

There remains a need for improved methods for producing long aligned nanotubes by catalytic decomposition of carbon-containing gases. These nanotubes can be used to make nanotube fibers, twine or braid. Because of their length, these nanotubes may also be used in applications that do not require that they be combined into such grouped strands.

SUMMARY OF THE INVENTION

The invention provides CVD-based methods for growing single-walled or multi-walled carbon nanotubes. In conventional CVD-based methods, the CVD decomposition environment is shared by the nanotube growth environment. In the methods of the invention, the nanotube growth environment is separated from the carbon-containing gas feed environment, resulting in nanotubes of high purity, uncontaminated by other carbon phases. Therefore, costly and time-consuming post processing purification to remove unwanted carbon phases is not required. The methods of the invention can also avoid catalyst inactivation by unwanted carbon phases, e.g. by applying water vapor pulses in the carbon-containing gas feed environment, and reduce mass transport limitations and thus increase the length of the carbon nanotubes formed.

In the methods of the invention, a membrane is used to separate the feed and nanotube growth environments, so that the nanotubes are grown in an atmosphere which does not contain substantial quantities of gaseous carbon-containing materials. In particular, the nanotubes are grown from one side of a specially engineered membrane that comprises a layer which is substantially impermeable to gas flow. In an embodiment, the layer is non-porous. Carbon is supplied to the nanotube growth side of the membrane layer by catalytic decomposition of a gaseous carbon-containing material at the feed side of the membrane layer and diffusion of that carbon through the layer to catalytic features that promote nanotube growth. In the methods of the invention, the membrane as a whole is substantially impermeable to gas flow, but allows carbon diffusion.

The membrane performs three functions: (1) catalysis of feed stock decomposition/adsorption, (2) diffusion of carbon from the feed side to the growth side of the layer and (3) catalysis of carbon nanotube formation on the growth side of the layer. In one embodiment, these three functions are carried out by a single material. In another embodiment, a plurality of materials may be used to carry out these three functions. Each material may perform one or more of these functions. In addition, more than one material may be used to perform a given function. Additional materials may be present in the membrane which do not perform any of these functions and but provide functions such as supporting the catalyst particles or acting as a barrier to gas diffusion.

In an embodiment, the membrane comprises a porous template formed of a material or a combination of materials which does not provide for substantial amounts of carbon diffusion and a catalytic conduit material substantially filling the pores of the template. In this embodiment, the catalytic material is capable as acting as a catalyst for decomposition of the carbon-containing gas, providing for substantial amounts of carbon diffusion, and acting as a catalyst for carbon nanotube growth. The size of the pores of the template material influences the size of the catalyst features on either side of the membrane.

In another embodiment, the membrane comprises a solid film of a metal which provides for substantial amounts of carbon diffusion, a catalyst for decomposition of carbon-containing gas at the feed side of the membrane and a catalyst for carbon nanotube growth at the growth side of the membrane.

The methods of the invention provide improved mass transport of carbon to the catalyst at the growth side of the membrane as compared to other CVD processes. When a solid non-porous membrane is used to separate the nanotube growth and reaction gas environments, the relevant mode of carbon transport will be diffusion of carbon through the membrane. In contrast, in conventional CVD methods the relevant mode of carbon transport to the catalyst is transport of gaseous carbon-containing materials through the growing nanotube foliage to the catalyst.

In the methods of the invention, thermodynamic and kinetic parameters are selected that enhance CNT growth and limit formation of byproducts. These parameters can be specially tailored for each side of the membrane. The thermodynamic conditions (temperature, pressure, molar ratios, constituents) on the feed side can be controlled to maximize the catalytic cracking of carbon feedstock materials while minimizing the formation of byproducts that can poison the decomposition process (such as the formation of amorphous carbons and turbostratic graphites). Addition of accelerators like molybdenum and promoters can be added exclusively to the feed side. If required, specifically designed thermodynamic conditions on the growth side maximize the purity of the carbon nanotubes. If required, the thermodynamic conditions on the growth side can also be selected to enhance the bundling process during the growth process, thereby eliminating costly post-purification procedures. Temperature can be regulated by resistive heating of the membrane, targeted infrared heating or by conventional cavity methods. Kinetic parameters such as the strategic placement of accelerators and nanostructuring of catalyst surfaces can be controlled independently for both sides. The addition of electric field to align tubes is also available for the growth side.

In an embodiment, the invention provides a method for growing a carbon nanotube comprising the steps of:

providing a membrane having a feed side, a nanotube growth side, and a central region between the feed side and the growth side, wherein the feed side comprises a material capable of acting as a catalyst for decomposition of a carbon-containing gas, the nanotube growth side comprises a material capable of acting as a catalyst for nanotube growth, the central region does not comprise an anodic alumina membrane and the membrane is substantially impermeable to gas flow and permits diffusion of carbon from the material capable of acting as a decomposition catalyst on the feed side to the material acting as a nanotube growth catalyst on the growth side;

providing a reaction gas comprising a carbon-containing gas at the feed side of the membrane and providing an atmosphere which does not contain substantial quantities of carbon-containing gas at the growth side of the membrane;

decomposing the carbon-containing gas on the material capable as acting as a catalyst for decomposition of the gaseous carbon-containing material, thereby generating carbon;

diffusing at least some of the carbon generated by decomposition of the carbon-containing material through the membrane to the material capable of acting as a catalyst for nanotube growth; and growing a nanotube at the material capable of acting as a catalyst for nanotube growth.

DETAILED DESCRIPTION OF THE INVENTION

Figure 1:
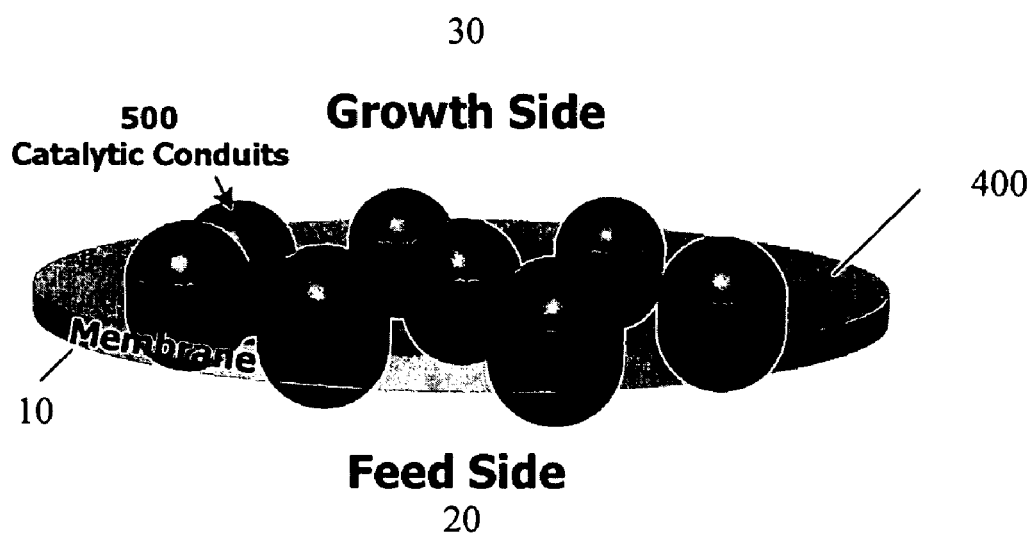
FIG. 1 shows a membrane suitable for use with the invention that has catalytic conduits which extend from the growth side to the feed side of the membrane.

The inventive methods for making nanotubes employ a membrane which comprises a layer which is substantially impermeable to gas flow and permits diffusion of carbon through the layer. This membrane allows separation of the feed and growth environments for the carbon nanotubes. The nanotube growth side of the gas-impermeable layer is generally located at the nanotube growth side of the membrane. In an embodiment, the whole of the membrane, rather than just a layer of the membrane, is substantially impermeable to gas flow and permits diffusion of carbon therethrough. In different embodiments, the thickness of the membrane is greater than 0.25 micron, greater than 1 micron or between 1 and 5 microns. If necessary, the membrane can be supported on the feed side with a structure that is not capable of producing nanotubes or carbon byproducts at the CVD temperatures and that has pores large enough not to constrict gas supply to the feed side of the membrane. Typically, the pore size of the mechanical support will be significantly larger than the size of the catalyst features on the feed side of the membrane. For example, a membrane can be supported with a stainless steel grid.

The membrane may be planar or nonplanar. In an embodiment, the membrane is cylindrical and the carbon nanotubes are grown on the interior of the cylinder. In another embodiment, the membrane may form a closed surface either during or following nanotube growth. However, to obtain a controlled environment inside the "closed" surface some access to the interior environment is needed either prior to or during nanotube growth. For example, prior to growth the space substantially enclosed by the surface may be pressurized with an inert gas or evacuated.

Both the membrane and the gas-impermeable membrane layer have a feed side and a nanotube growth side. The feed side and the growth side are on opposing faces of the membrane.

At the feed side of the gas-impermeable membrane or membrane layer, the carbon-containing reaction gas is decomposed to form carbon. The feed side of the gas-impermeable membrane or membrane layer comprises a material capable of acting as a catalyst for decomposition of a gaseous carbon-containing material. This material may also be referred to as a decomposition catalyst. As used herein, the decomposition catalyst is capable of catalytic decomposition of the carbon-containing portion of the reaction gas at the process conditions. The decomposition catalyst also allows substantial amounts of carbon diffusion. Suitable catalyst materials for decomposing carbon-containing gases are known to those skilled in the art and include transition metals, and particularly the Group VIB transition metals (chromium, molybdenum, and tungsten) or Group VIIIB transition metals (iron, cobalt, nickel, ruthenium, rhodium, palladium, osmium, iridium, and platinum) and mixtures thereof. In an embodiment, the materials are selected from the group consisting of cobalt, nickel, iron, and mixtures thereof. The gas decomposition catalyst may also include additional elements such as molybdenum to enhance decomposition of the carbon-containing material. The molybdenum may be alloyed with other catalytic elements and/or be present on the surface of the feed side of the membrane. Molybdenum may be deposited on the surface of the membrane by sputtering or by any other suitable method known by those skilled in the art. It is believed that under certain conditions the presence of molybdenum features or a molybdenum layer on the feed side will reduce the likelihood of carbon nanostructure formation on the feed side. In an embodiment, the catalyst is a mixture of molybdenum with cobalt, nickel, or ion. In addition, any material known to the art to promote or accelerate decomposition (e.g. sulfur, potassium) can be added to the feed side. The choice of the decomposition catalyst material, the temperature on the feed side of the membrane, and the diffusivity of carbon through the membrane layer are chosen so that carbon nanotube growth on the feed side of the membrane layer is either absent or diminished.

At the nanotube growth side of the membrane, nanotubes are grown at a material capable of acting as a catalyst for nanotube growth. This material may also be referred to as a nanotube growth catalyst. As used herein, a catalyst for nanotube growth allows growth of carbon nanotubes from its surface, and also allows substantial diffusion of carbon. Suitable catalyst materials for catalyzing carbon nanotube growth are known to those skilled in the art and include transition metals, and particularly the Group VIB transition metals (chromium, molybdenum, and tungsten) or Group VIIIB transition metals (iron, cobalt, nickel, ruthenium, rhodium, palladium, osmium, iridium, and platinum) and mixtures thereof. In an embodiment, the materials are selected from the group consisting of cobalt, nickel, iron, and mixtures thereof. In another embodiment, the material is a mixture of molybdenum with cobalt, nickel, or iron (e.g. Mo—Fe, Mo—Co, Mo—Ni). The material capable of acting as a catalyst for decomposition of the gaseous carbon-containing material and the material capable of acting as a catalyst for nanotube growth may be the same material or may be different materials. If the decomposition catalyst and the nanotube growth catalyst are of the same material, they may or may not be physically connected to one another.

Generally, the carbon nanotube growth catalyst is present on the growth side of the membrane as discrete features such as islands, particles, pyramids, facets or other surface features. The features may be sharpened via anodic sharpening. In general, these features do not contact each other on the growth surface of the membrane. These features may be flush or elevated with respect to the rest of the growth side of the membrane. The rest of the growth side of the membrane may be surface coated to increase the strength of the interaction between the catalytic features and the membrane surface and thus increase the likelihood of base growth of the carbon nanotubes. In an embodiment, the rest of the growth side of the membrane is alumina coated, The size of the carbon nanotube growth catalyst features on the growth side of the membrane layer influences the size and structure of the carbon nanotube. Catalytic features less than 3 nm wide at the growth side of the membrane layer are expected to produce single-walled nanotubes. In addition, the size or width of the catalytic features can be further tailored to grow single-walled nanotubes of the desired chirality by taking advantage of the geometric constraint that relates chirality to tube diameter. As is known to those skilled in the art, the chirality is dependent upon the tube diameter and the vectors m and n. Catalytic features 3-10 nm are expected to produce double walled or multi-walled nanotubes. Catalytic features 10-50 nm are expected to produce multi-walled nanotubes. Catalytic features greater than 50 nm in are expected to produce herring bone tubes or solid carbon fibers. As used herein, the size of the catalytic feature refers to its characteristic width, which is equal to the diameter for circular catalytic features. Uniformity in size of the catalytic features, especially at smaller sizes, is expected to produce greater nanotube size uniformity.

The carbon nanotube growth catalyst features may be arranged in a regular pattern on the growth side of the membrane. As used herein, a regular pattern is not random arrangement, although the pattern need not repeat itself perfectly. In different embodiments, the pattern of catalytic features forms a generally hexagonal or a generally square array. The catalytic features may be different sizes at the different sides of the membrane or membrane layer. For example, the decomposition catalyst features at the feed side may be larger than the nanotube growth catalyst features at the growth side to enhance decomposition of the carbon-containing material. The decomposition catalyst features at the feed size may also have a lower curvature than the than the growth features at the growth side. Higher curvature features are believed to encourage catalytic growth.

The catalytic features on the growth side of the membrane may be dispersed on the membrane surface in close proximity to one another so that the nanotubes that grow from the membrane form bundles of generally aligned nanotubes as a result of van der Waals attraction between the nanotubes. In this embodiment, the spacing between the nanotubes is less than about two nanotube diameters.

Alternatively, the catalyst features may be dispersed on the membrane growth surface so that there is clear separation between the clusters, so that the nanotubes that grow from the support are separate from one another. In an embodiment, the spacing between the catalyst features is approximately twice the width of the catalyst features.

The membrane further comprises a central region located between the feed and growth sides of the membrane. This central region comprises a material which allows diffusion of carbon from the carbon decomposition catalyst to the carbon nanotube growth catalyst. The material selected to enable carbon transport through the membrane layer is chosen so as to optimize that process while disallowing permeation of the feedstock and, if desired, non-carbon feedstock constituents. The structure and composition of this central region depends upon the particular membrane configuration. In an embodiment, the central region does not comprise anodic alumina oxide.

In an embodiment, the functions of catalysis of feed stock decomposition/adsorption, diffusion of carbon from the feed side to the growth side of the layer and catalysis of carbon nanotube formation on the growth side of the layer are carried out by a single material. In the membrane configuration shown in FIG. 1, the membrane (10) comprises catalytic conduits (500) of a first material in a second material (400). The first material carries out the functions of catalysis of feed stock decomposition/adsorption, diffusion of carbon from the feed side (20) to the growth side (30) of the membrane and catalysis of carbon nanotube formation on the growth side of the membrane. In an embodiment, the diffusivity of carbon is greater in the first material than in the second material so that transport of carbon across the membrane occurs primarily through the conduit(s). In this embodiment, the reaction conditions are controlled so that substantial nanotube growth does not occur at the feed side of the membrane.

The membrane configuration having catalytic conduits can be fabricated using a variety of methods. In an embodiment, the second material is a layer of a porous gas-permeable material whose pores can be at least partially filled with the first material to form the conduit. The porous second material thus acts as a support and template for the conduit material. The pores are substantially filled with the conduit material. When the pores are substantially filled, the pores are sufficiently filled with the conduit material to allow carbon diffusion through the membrane and to make the membrane substantially impermeable to the carbon-containing gas. In an embodiment, the conduit material also sufficiently fills the pore material so that no nanotubes are grown within the pores of the membrane. In an embodiment, the conduit material is more unified than would be provided by simple packing of particles. In addition, the conduit material may extend past the end of the pore so that the conduit material projects beyond the face or plane of the bulk of the membrane, as shown in FIG. 1. In an embodiment, the pore size determines the conduit size, which in turn determines the size of the catalytic features at the growth side of the membrane. If the conduit material projects pasts the face of the bulk of the membrane, the size of the catalytic features may be further adjusted by shaping the projecting material. The size of the catalytic features may be adjusted by anodic sharpening or by nanolithographic techniques.

Suitable porous materials include, but are not limited to porous ceramics other than anodic aluminum oxide, silicon and ceramic coated porous metals. The mismatch between the coefficient of thermal expansion of the porous support material and the catalytic conduits is an important parameter. The mismatch between the support material and the conduit material should be sufficiently low that cracks do not form in the membrane. In addition, the structure of the porous material should be sufficiently homogenous that application of thermal stress will not cause cracking or curling. As-formed anodic aluminum oxide is believed to be unsuitable for use as a template in the invention because of the non-homogeneity of its structure, including the difference in pore structure between the solution and the barrier side of the membrane.

Suitable ceramics include, but are not limited to silica and alumina coated silica. As is known in the art, mesoporous molecular sieves can be synthesized using surfactant molecules as a template. For example, silica based MCM-41 can be made with pore sizes between 2 and 10 nm. Other mesoporous silicas include FSM-16 and SBA-15. The mesoporous silica can be synthesized in thin film form. The pore size of the porous support may be reduced as desired by CVD coating of the interior of the pores. For example, it is known that atomic layer deposition (ALD) can be used to coat pores in anodic aluminum oxide (AAO) and silica aerogel monoliths (Xiong, G. et al. 2005, J. Phys. Chem. B, 109, 14059-14063; Kucheyev, S. O. et al., 2005, Appl. Phys. Lett., 86, 083108).

Techniques for atomic layer deposition on a variety of other materials are known to those skilled in the art.

Suitable ceramic coated porous metals include, but are not limited to ceramic coated molybdenum, tungsten, iron, nickel and cobalt. In an embodiment, the ceramic coating is of alumina. The ceramic coating limits carbon diffusion through the second material. In addition, if the porous metal is a material which is capable of acting as a catalyst for nanotube growth, the ceramic coating on the growth face of the membrane limits growth of carbon structures away from the catalytic features. The ceramic coating is applied to the faces of the porous metal layer as well as to the interior of the pores. As previously discussed, ceramic coatings may be applied using chemical vapor deposition techniques known to the art, including atomic layer deposition.

Porous metal membrane layers (and other porous membrane compositions such as silicon) can also be made by making pores in a nonporous material. Porous membrane design and fabrication may be accomplished by any method known to those skilled in the art, including, but not limited to, extant lithographic methods, nanolithography, chemical reactive scanning tunneling microscope processes, anodization, and molecular deposition. Nanolithographic techniques are capable of producing features 10-100 nm. Nanoimprint lithographic (NIL) techniques are capable of producing resist features less than 6 nm. The NIL technique is described by Chou in U.S. Pat. No. 5,772,905. The pattern can then be transferred to a substrate by etching to form a membrane. Etching techniques known to the art include reactive ion etching and chemical etching.

The pore size in the porous support should be suitable to produce the desired conduit size. The pore size need not be uniform across the thickness of the membrane. In an embodiment, the pore size of the template material is smaller at what will become the nanotube growth side of the membrane and larger at what will become the feed side of the membrane.

The second material which forms the porous support may also be surface-coated with another material. For example, a porous material may be surface-coated with alumina at the nanotube growth side of the membrane layer (prior to addition of conduit material). The chemical composition of the second material or any surface coating on the second material may influence whether the nanotube grows by tip or base growth. In an embodiment, the membrane composition is selected to produce base growth of nanotubes. Use of a porous material surface coated with alumina is expected to produce base growth. Surface coating of the feed side of the membrane with a material such as molybdenum or a molybdenum alloy can be used to limit undesired nanotube formation (coating applied after addition of conduit material.

The conduit material can be placed in the pores by wicking molten metal into the porous support, aqueous incipient wetness impregnation (AIWI), autocatalytic electroless deposition, d.c. electrochemical deposition, spin-on deposition, RF plasma sputtering, ion-beam methods, gas-phase decomposition of ferrocenes or by any other method known to those skilled in the art which is sufficient to introduce the catalyst into the pores and produce the required resistance of the membrane layer to gas flow. Excess metal can be removed by ion milling techniques or mechanical-chemical polish techniques. In an embodiment, no flux of the gas comprising the carbon-containing material through the membrane layer can be detected. In an embodiment, the material in the conduits is more consolidated than is obtained by a simple packing of particles.

Materials capable of acting as both decomposition and nanotube growth catalysts include, but are not limited to cobalt, nickel, iron, mixtures thereof, and mixtures of molybdenum with cobalt, nickel or iron.

Figure 2:
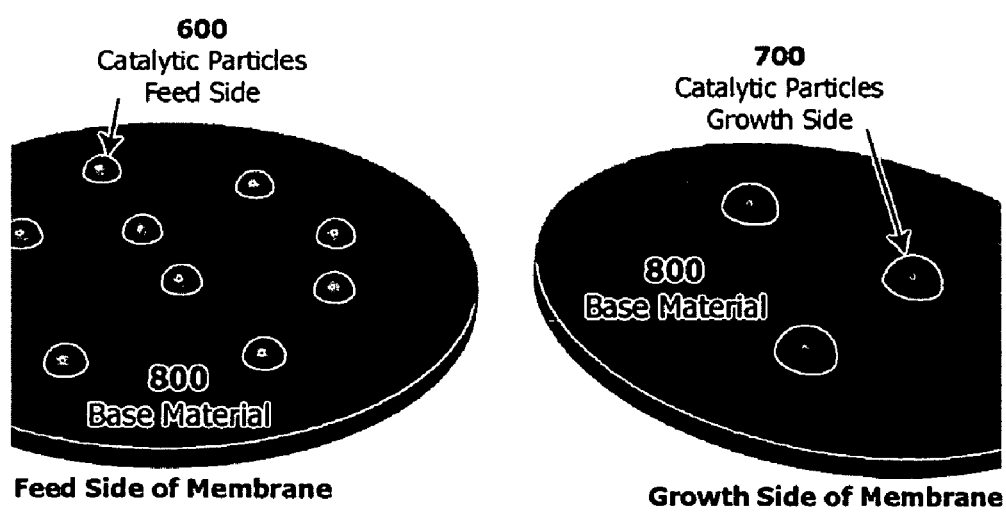
FIG. 2 shows a membrane suitable for use with the invention that has catalytic particles of a first material supported on the feed side of the membrane and catalytic particles of a second material supported on the growth side of the membrane.

In another membrane configuration, illustrated in FIG. 2, particles of a first material (600) act as a catalyst for feed stock decomposition/adsorption and are located on the feed side of the membrane. Particles of a second material (700) act as a catalyst for nanotube growth and are located on the nanotube growth side of the membrane. The catalyst particles (600) and (700) are supported on a base material (800) which allows diffusion of carbon from decomposition catalyst particles to the nanotube growth catalyst particles (through the volume of the foil or along grain boundaries of a polycrystalline metal material). Suitable materials for the nanotube growth catalyst are the same as those previously described. Suitable materials for the decomposition catalyst include materials which decompose the carbon containing gases, but do not produce substantial nanotube growth at the reaction conditions. These materials include those materials previously described as decomposition catalysts and molybdenum and molybdenum alloys. Suitable materials for the base material include, but are not limited to polycrystalline metals. Suitable metals include, but are not limited to Fe, Ni, and Co. In an embodiment, the first and second material are different in composition but the base material may have the same composition as either the first or second material. The base material and the catalysts materials can be annealed to form alloys and "intimate contact" along the diffusion stream.

This membrane configuration in FIG. 2 can be made as follows. Sputter a thin layer of Mo on one side of a polycrystalline.metal foil. Anneal the Mo film to form decomposition catalyst features through film break-up. Sputter a thin film of Fe on the other side of the foil and anneal the Fe film to form growth catalyst features through film breakup. As an alternative, the catalyst features on the growth side can be formed by roughening the growth side. Lithographic techniques can also be used to pattern catalyst placement.

In another embodiment, both the feed and growth sides of the membrane layer comprise a first material which is capable of acting as a catalyst for decomposition of the gaseous carbon-containing material and capable of acting as a catalyst for nanotube growth and the membrane layer further comprises a second material which allows diffusion of carbon from the feed side to the growth side of the membrane layer. In this case, the reaction conditions are controlled so that substantial nanotube growth does not occur at the feed side of the membrane. Materials capable of acting as both decomposition and nanotube growth catalysts include, but are not limited to, cobalt, nickel, iron, mixtures thereof, and mixtures of molybdenum with cobalt, nickel or iron.

In another membrane configuration, a single material may form the whole of the membrane, with raised catalytic cluster or particle surface features on the feed side of the membrane to catalyze carbon decomposition and adsorption and raised catalytic cluster or particle features on the growth side of the membrane provided to control the nanotube size and structure. The surface features may take any suitable form, including ridges, mounds or bumps of the appropriate size. This configuration is similar to that shown in FIG. 2, except that the surface features are of the same material as the base material. With this membrane design, the combination of kinetic and thermodynamic controls is adjusted so that substantial nanotube growth does not occur at the feed side of the membrane. Kinetic controls include catalyst curvature and the length of the diffusion path.

In this membrane configuration, the membrane material may be any suitable catalytic material known to the art. Exemplary catalytic materials include cobalt, nickel, iron, mixtures of iron, cobalt and nickel (e.g. Fe—Co, Fe—Ni, Co—Ni) and mixtures of molybdenum with iron, cobalt or nickel (e.g. Mo—Fe, Mo—Co, Mo—Ni). As used herein, mixtures of two metals include alloys of the two metals.

In another membrane configuration a central region of the membrane comprises a thermally insulating but carbon transporting layer between two metal films. The thermally insulating but carbon transporting layer may be a carbon aerogel.

The methods of the invention allow control of the decomposition rate of the carbon-containing material by controlling the geometry of the catalytic particles or conduits on the feed side of the membrane layer and the thermodynamics of the reaction environment on the feed side of the membrane layer. The diffusion rate of carbon through the membrane layer is controlled by design of the diffusion path (conduit or otherwise) through the layer. The methods of the invention further allow control of the nanotube structure through control of the geometry of the catalytic particles, conduits or surface features on the growth side of the membrane and control of the thermodynamic environment on the growth side. The surfaces of the membrane can be coated so as to independently optimize the wetting angle of the catalyst on either side so long as C diffusion to the catalyst is not blocked.

Atomistic simulation can be used to predict the carbon nanotube structure that results from a given particle, conduit, or surface feature configuration. The atomistic simulator can be based on a reactive force field, molecular dynamics model which accurately captures the bonding interactions between carbon and the catalytic metal cluster. The parameters in this simulator are filled using ab initio (density functional theory) data. The simulation can be used to model adsorption and diffusion on and through the catalytic particle, conduit or surface feature as well as nucleation of the carbon nanotube from the metal-containing cluster.

In an embodiment, the membrane is chemically, thermally, and/or mechanically pretreated prior to prior to nanotube growth. Suitable pretreatment conditions depend on the membrane materials as are known to those skilled in the art. For example, the membrane may be exposed to a hydrogen-carrier gas mixture at an elevated temperature to pretreat the membrane and sensitize the catalyst. Pretreatment of the membrane can also be used to remove water from the membrane and reduce the catalyst into its active form.

As used herein, the term "nanotube" refers to a tube-shaped discrete fibril typically characterized by a substantially constant diameter of typically about 1 nm to about 100 nm. Single walled nanotubes have diameters from about 0.5 to about 2.0 nm. In addition, the nanotube typically exhibits a length greater than about 10 times the diameter, preferably greater than about 100 times the diameter. Carbon nanotubes can be visualized as cylindrical carbon macromolecules of variable length or, alternatively, as sheets of graphite rolled into tubes. Carbon nanotubes have been prepared that have a single layer, a double layer, or multiple layers. The term "multi-wall" as used to describe nanotubes refers to nanotubes having a layered structure, so that the nanotube comprises an outer region of multiple continuous layers of ordered atoms and an optional distinct inner core region or lumen. The layers are disposed substantially concentrically about the longitudinal axis of the fibril.

A reaction gas comprising a gaseous carbon-containing material is provided to the feed side of the membrane. Suitable carbon containing gases are known to those skilled in the art. In an embodiment, suitable carbon-containing gases for use with the invention are gases selected from the group consisting of: methane, acetylene, propylene, ethylene, various alcohols, carbon dioxide, carbon monoxide and mixtures thereof. Higher saturated and unsaturated hydrocarbons can also be used with the invention if pyrolytic decomposition is controlled. In an embodiment, the carbon-containing gas is methane. The partial pressure of the carbon feedstock gases can be controlled to maximize decomposition. The partial pressure of the carbon feedstock gases is also controlled to limit carbide formation in the catalyst metals. The reaction gas may also contain other gases such as hydrogen, oxygen, an inert carrier gas and mixtures thereof. In an embodiment, the hydrogen content is less than 5% of the total pressure and the inert carrier gas content is greater than 80% of the total pressure. Suitable carrier gases include, but are not limited to, argon, nitrogen, helium, neon and mixtures thereof. In an embodiment, the reaction gas environment may further comprise an activator such as potassium (solid), molybdenum (solid) or an enhancer such as thiophene (gas phase) In different embodiments, reaction gas has a methane partial pressure of about 10% and a hydrogen partial pressure of about 5% or a methane partial pressure of about 10% and a hydrogen partial pressure of about 10%. The reaction gas environment may also comprise water vapor added to limit or prevent catalyst fouling.

In this embodiment, for SWNT formation the temperature in the feed zone is between about 600° C. and about 800° C. SWNTs have also been shown to form at 550° C. in alcohol (Maruyama, 2004, J. Nanoscience and Nanotech 4 360).

In the methods of the invention, no pressure differential is required across the membrane (i.e. the pressure on the feed and growth sides of the membrane can be the same). In general, the pressure on the feed side of the membrane is atmospheric or sub-atmospheric. In different embodiments, the pressure at the feed side of the membrane is between about 400 and about 760 torr, between about 400 and about 600 torr, and about 600 torr.

The atmosphere in the nanotube growth zone does not contain substantial quantities of gaseous carbon-containing materials. In an embodiment, the partial pressure of carbon-containing gas in the nanotube growth zone is less than about 10% of the partial pressure of carbon-containing gas in the feed zone. In an embodiment, the atmosphere in the nanotube growth zone is provided by a gas mixture comprising hydrogen in a carrier gas such as argon. The hydrogen can be added in higher quantities on the growth side than on the feed side. For example, the hydrogen pressure can be greater than 10% of the total pressure. Additional hydrogen can react with any potential amorphous carbon byproduct that has lower activation energy than SWNTs or MWNTs. The gas mixture in the nanotube growth zone may also comprise oxygen and/or water to enhance the in situ purification process. In an embodiment, the gas mixture in the growth zone comprises about 10% hydrogen in argon. In an embodiment, the pressure in the growth zone is subatmospheric. In another embodiment, the pressure on the growth side may be higher to present positive pressure and flow into the feed side to prevent leaks. Water is used primarily in the feed zone to prevent catalyst fouling but can also be applied to the growth zone.

In an embodiment, the growth zone is maintained within a temperature range of about 670° C. to about 800° C. As described in United States Patent Application No. 2002/0172767 to Grigorian et al., use of temperatures in this range can provide higher yields of SWNT material and reduce the formation of amorphous carbon. In another embodiment, the temperature at the growth side is between 600° C. and 700° C. If the membrane is resistively heated, cool temperatures in the growth zone would eliminate the formation of contamination by fugitive carbon feedstock materials.

In an embodiment, a reaction apparatus can be used in which a sealing chamber holds the membrane. Two additional chambers which enable atmosphere control are provided, each additional chamber being attached to one side of the sealing chamber. The atmosphere in each chamber is controlled by continuously flowing a gas mixture through it. The pressure on each side of the membrane can be monitored and controlled independently. Pressure relief is provided for each side. The chambers may be of any suitable material, including stainless steel or quartz. Sealing washers are typically used to seal the membrane into the chamber. For silica or other ceramic membranes the sealing washer may be made of any suitable flexible material including flexible graphite such as GraFoil® (Graftech International, Wilmington, Del.). The sealing chamber may be resistively heated. The feed and nanotube growth environments may be separated as described above or by any other method known to those skilled in the art. In an embodiment, the membrane may be supplied with additional heat to enhance the catalyst process. If the membrane is made of a metal or oxidized metal the membrane may be resistively heated. In another embodiment, nanotube growth may be stimulated by use of a plasma, or through infrared or reaction cavity heating.

In another embodiment, an electric field can be applied along the growth zone. In an embodiment the electron field lines are approximately perpendicular to the surface of the membrane. In an embodiment, the electric field lines can be used to assist aligning and grouping of nearby nanotubes.

In another embodiment, the nanotubes may be grown between a free-floating cap pier and the membrane.

Prior to nanotube growth, both the feed and the growth zones may be purged by evacuation and back-filling with a mixture of hydrogen and carrier gas. In an embodiment, the carrier gas is argon. The feed and growth zones are then re-evacuated and filled with the appropriate gases.

The CNTs can be harvested by termination or quenching of the feed reaction mechanisms leading to chemical cutting (application of hydrogen to feed side) of the CNTs on the growth side. and/or the application of laser and/or chemical cutting. After the CNTs are harvested, the membrane/catalyst structure may be chemically, thermally or mechanically regenerated.

The nanotubes can also be left attached to the membrane and the combination of the nanotubes and the membrane used in a device. For example, a cylindrical filter can be made which has nanotubes attached to the inner surface of a cylindrical membrane. For this application, most of the nanotubes are at least as long as half the diameter of the cylinder. Typically, most of the nanotubes will be longer to ensure sufficient filling of the interior of the cylinder. The filter is made by using a cylindrical membrane and growing nanotubes from catalytic features on the membrane's inner surface. The ends of the cylinder are sealed during the nanotube growth mixing to aid in separation of the feed and growth environments. As another example, nanotubes grown from two planar membranes can be meshed together either during or following nanotube growth.

The invention also provides carbon nanotube fibers made by assembling several nanotubes. In an embodiment, the invention provides a method for making a fiber comprising a plurality of nanotubes, comprising the steps of:

making a plurality of nanotubes according to the methods of the invention; and assembling the nanotubes to form a fiber.

Nanotubes may be assembled into a fiber by van der Waals interactions if the catalytic conduits are spaced close enough together. These fibers may be subsequently twisted or braided.

Figure 3:
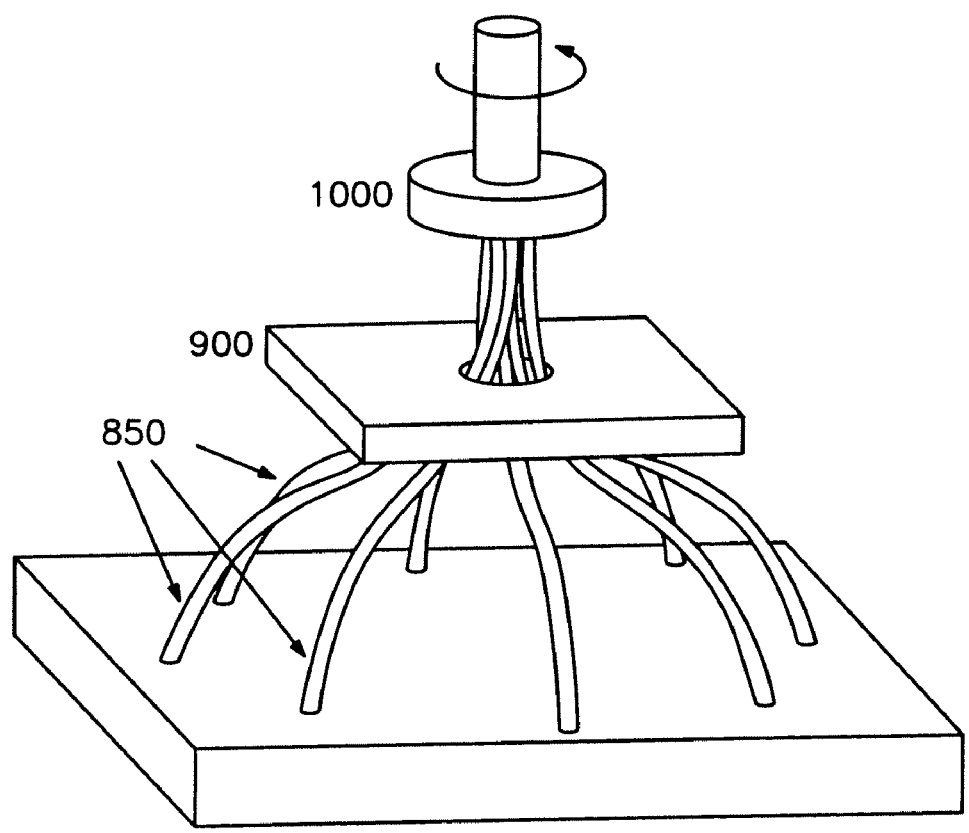
FIG. 3 shows a mechanical apparatus for twining nanotubes or nanotube fibers.

In another embodiment, the free end of adjacent carbon nanotubes or van der Waals formed carbon nanotube fibers are twined or braided together while still attached to the membrane. Twining or braiding may be achieved by mechanically, electrically, or electro-mechanically. For example, as shown in FIG. 3, the free ends of adjacent carbon nanotubes (850) may be fed through a collector ring (900) and attached to a plate (1000). The plate is then rotated and the nanotubes are entwined. Van der Waals forces will hold the twine together after it is removed from the membrane and plate. Braided fibers can be accomplished by a slightly more sophisticated interplay of three or more rotating disks. A combination of twining and braiding can also be accomplished by a grid of rotating spatially localized electric fields which induce a torque on the tubes.

Post-processing of carbon nanotube fibers is also encompassed by the invention. In-situ post-processing can include coiling of the carbon nanotubes using sulphur additives. Furthermore, composites can be created in-situ by rolling the carbon nanotubes against the membrane and subsequently embedding them with an epoxy or any other suitable polymer. Carbon nanotube fibers produced by the methods of the invention can also be woven into fabric.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. Any recitation herein of the term "comprising", particularly in a description of components of a composition or in a description of elements of a device, is understood to encompass those compositions and methods consisting essentially of and consisting of the recited components or elements. The invention illustratively described herein suitably may be practiced in the absence of any element or elements, limitation or limitations which is not specifically disclosed herein.

Whenever a range is given in the specification, for example, a temperature range, a time range, or a composition range, all intermediate ranges and subranges, as well as all individual values included in the ranges given are intended to be included in the disclosure.

Although the description herein contains many specificities, these should not be construed as limiting the scope of the invention, but as merely providing illustrations of some of the embodiments of the invention. Thus, additional embodiments are within the scope of the invention and within the following claims. All references cited herein are hereby incorporated by reference to the extent that there is no inconsistency with the disclosure of this specification. Some references provided herein are incorporated by reference herein to provide details concerning additional starting materials, additional methods of synthesis, additional methods of analysis and additional uses of the invention.

In general the terms and phrases used herein have their art-recognized meaning, which can be found by reference to standard texts, journal references and contexts known to those skilled in the art. The preceding definitions are provided to clarify their specific use in the context of the invention.

Example

Formation of a Membrane for Growth of Multi-Walled Nanotubes

A template is formed by creating nanoholes in either a Mo metal foil or a silica material (thickness 0.25 micron to 1 micron). The nanoholes (pores) are 20 nm, 30 nm, or 40 nm in diameter and are formed with nanolithography.

A layer (a few nm to greater than 5 nm thick) of alumina is applied to the interior of the nanoholes and the faces of the template via atomic layer deposition.

A catalyst containing Fe, Ni, or Co is then inserted into the nanoholes, substantially filling them. Subsequently, a Mo film is applied to the feed side of the membrane.

We claim:

1. A method for growing a carbon nanotube comprising the steps of:
   a. providing a membrane having a feed side, a nanotube growth side, and a central region between the feed side and the growth side, wherein the feed side comprises a material capable of acting as a catalyst for decomposition of a carbon-containing gas, the nanotube growth side comprises a material capable of acting as a catalyst for nanotube growth, the central region does not comprise an anodic alumina membrane and the membrane is substantially impermeable to gas flow and permits diffusion of carbon from the material capable of acting as a decomposition catalyst on the feed side to the material acting as a nanotube growth catalyst on the growth side;
   b. providing a reaction gas comprising a carbon-containing gas at the feed side of the membrane and providing an atmosphere which does not contain substantial quantities of carbon-containing gas at the growth side of the membrane;
   c. decomposing the carbon-containing gas on the material capable as acting as a catalyst for decomposition of the gaseous carbon-containing material, thereby generating carbon;
   d. diffusing at least some of the carbon generated by decomposition of the carbon-containing gas through the membrane to the material capable of acting as a catalyst for nanotube growth; and
   e. growing a nanotube at the material capable of acting as a catalyst for nanotube growth.

2. The method of claim 1, wherein the thickness of the membrane is between 0.25 and 5 microns.

3. The method of claim 1, wherein the membrane is generally planar.

4. The method of claim 1, wherein the membrane is non-planar.

5. The method of claim 4, wherein the membrane is cylindrical.

6. The method of claim 1, wherein the nanotube grown is a double-walled or multi-walled nanotube.

7. The method of claim 1, wherein the nanotube grown is a single-walled nanotube.

8. The method of claim 1, wherein a plurality of carbon nanotubes are grown.

9. The method of claim 1, wherein the material capable of acting as a catalyst for nanotube growth takes the form of discrete features arranged in a regular pattern on the growth side of the membrane.

10. The method of claim 9, wherein the features are arranged in a hexagonal array.

11. The method of claim 9, wherein the features are arranged in a square array.

12. The method of claim 1, wherein material capable of acting as a catalyst for nanotube growth takes the form of discrete features having a size between 1 nm and 100 nm at the growth side of the membrane.

13. The method of claim 1, further comprising the step of applying an electric field during nanotube growth such that the electric field lines are approximately perpendicular to the growth side of the membrane.

14. The method of claim 1, wherein the membrane comprises a first material capable of acting as a catalyst for decomposition of the carbon-containing gas, acting as a catalyst for nanotube growth and providing for diffusion of carbon from the feed side to the growth side of the membrane, the first material substantially filling the pores of a second material, the second material forming a layer and having at least some pores which extend from the feed side to the growth side of the membrane, the second material not being capable of acting as a catalyst for decomposition of the carbon-containing gas, acting as a catalyst for nanotube growth or providing for substantial diffusion of carbon from the feed side to the growth side of the membrane.

15. The method of claim 14, wherein the pores have a diameter between 1 and 10 nm at the growth side of the membrane.

16. The method of claim 14, wherein the first material is selected from the group consisting of iron, nickel, cobalt, and combinations thereof.

17. The method of claim 14, wherein the second material is selected from the group consisting of silicon and silicon dioxide.

18. The method of claim 14, wherein the second material is a ceramic coated metal.

19. The method of claim 1, wherein the feed side of the membrane comprises a first material which is capable of acting as a catalyst for decomposition of the carbon-containing gas, the growth side of the membrane comprises a second material which is capable of acting as a catalyst for nanotube growth and the membrane further comprises a third material which allows diffusion of carbon from the first material to the second material, the first and second material taking the form of discrete features.

20. The method of claim 19, wherein the first material is molybdenum or a molybdenum alloy and the second material is selected from the group consisting of cobalt, nickel, iron, and mixtures thereof.

21. The method of claim 19, wherein the third material is selected from the group consisting of cobalt, nickel, iron and mixtures thereof.

22. The method of claim 1, wherein the membrane comprises a material which is capable of acting as a catalyst for decomposition of the carbon-containing gas, acting as a catalyst for nanotube growth, and allowing diffusion of carbon through the membrane and raised catalyst features are present on both the feed side and the growth side of the membrane.

23. The method of claim 22, wherein the membrane material is selected from the group consisting of cobalt, nickel, iron, iron cobalt mixtures, iron nickel mixtures, cobalt nickel mixtures, molybdenum cobalt mixtures, molybdenum nickel mixtures and molybdenum iron mixtures.

24. A method for making a fiber comprising a plurality of nanotubes, the method comprising the steps of:
   making a plurality of nanotubes according to the method of claim 1; and
   assembling the nanotubes to form a fiber.

25. The method of claim 24, wherein the fiber is assembled by van der Waals interactions between the nanotubes.

26. The method of claim 24, wherein the fiber is assembled by twisting together nanotubes.

27. The method of claim 24, wherein the fiber is assembled by twisting together a plurality of nanotube groups, each group of nanotubes being bound together by van der Waals interactions.

28. The method of claim 24, wherein the fiber is assembled by braiding together nanotubes.

29. The method of claim 24, wherein the fiber is assembled by braiding together a plurality of nanotube groups, each group of nanotubes being bound together by van der Waals interactions.

* * * * *